(12) United States Patent
Drayer

(10) Patent No.: US 6,172,926 B1
(45) Date of Patent: Jan. 9, 2001

(54) OPTICAL DATA STORAGE DEVICES AND METHODS

(75) Inventor: Phillip M. Drayer, Mountain View, CA (US)

(73) Assignee: TelCom Semiconductor, Inc.

( * ) Notice: Under 35 U.S.C. 154(b), the term of this patent shall be extended for 0 days.

(21) Appl. No.: 09/465,636

(22) Filed: Dec. 17, 1999

(51) Int. Cl.[7] .................................................. G11C 7/00
(52) U.S. Cl. ........................................ 365/215; 365/234
(58) Field of Search ................................. 365/215, 234, 365/217, 106, 64

(56) References Cited

U.S. PATENT DOCUMENTS 5,740,117 * 4/1998 Bona et al. ........................ 365/215

OTHER PUBLICATIONS

"Polarization Mode Dispersion Compensation at 20 Gb/s with Fiber–Based Distributed Equalizer" by Noé, Sandel, et al, 4 pages, by Universität Paderborn, FB 14/850 & Siemens AG, Nov. 2, 1999.

"Wide–Band Dispersion Compensating Optical Fiber" by Goel and Shevgaonkar in 1997 p. 1–2 vol. 8, No. 12, Dec. 1996, IEEE Photonics Technology Letter.

* cited by examiner

*Primary Examiner*—David Nelms
*Assistant Examiner*—David Lam
(74) *Attorney, Agent, or Firm*—James J. Murphy, Esq.; Winstead Sechrest & Minick

(57) ABSTRACT

An optical memory 200 including an optical storage element 301 for storing data as a packet of photons, optical storage element 301 delaying in time the packet of photons traveling through the storage element from a first point to a second point. A photon source 302 receives an electrical signal representing data and injects the packet on to optical storage element 301 in response, and a detector 303 selectively detects the packet traveling on optical storage element 301. A feedback path 306/305 couples photon source 302 and detector 303 for recirculating the packet through storage element 301.

20 Claims, 3 Drawing Sheets

OPTICAL DATA STORAGE DEVICES AND METHODS

FIELD OF THE INVENTION

The present invention relates in general to optical data storage devices and methods.

DESCRIPTION OF THE RELATED ART

Background of the Invention

Dynamic random access memory (DRAM) is the principal type of memory used in most applications such as personal computers (PCs). When compared, for example, to static random access memory (SRAM), DRAM is less expensive, consumes substantially less power, and provides more bits in the same chip space (i.e. has a higher cell density). DRAM is normally used to construct those memory subsystems, such as system memories and display frame buffers, where power conservation and high cell density are more critical than speed. In most computing systems, it is these subsystems which dominate the system architecture, thus making DRAM the prevalent type of memory device on the market.

In applications where access time is critical, such as in data and instruction caches, SRAM is normally used. Notwithstanding their present speed advantage over other types of devices, the ability to fabricate SRAM cells with ever decreasing access times will eventually become limited by device physics. This limitation on speed will then have to be considered in addition to the more traditional disadvantages of using SRAMs. Among other things, since SRAM cells essentially act as latches, they continuously sink current and hence consume a significant amount of power, as already noted above. Moreover, the typical SRAM cell is constructed from multiple transistors in a cross-coupled latch arrangement, which requires more silicon area on-chip than the typical DRAM cell, which typically is constructed from a single transistor and a charge storage capacitor.

Thus, the need has arisen for new memories which are not subject to the limitations of traditional SRAMs and DRAMs. These devices, and systems embodying them, should be capable of meeting the high speed data storage requirements expected for the next generations of information processing hardware. In addition to speed, such devices should also meet the expected high storage capacity (i.e high bit density) requirements for advanced processing applications.

SUMMARY OF THE INVENTION

An optical memory is disclosed which includes an optical storage element for storing data as a packet of photons, the optical storage element delaying in time the packet of photons traveling through the storage element from a first point to a second point. A photon source receives an electrical signal representing data and injects the packet onto the optical storage element in response. A detector is provided for selectively detecting the packet traveling on the optical storage element while a feedback path couples the photon source and detector for recirculating the packet through the storage element.

A data storage system is also disclosed which includes a plurality of optical storage elements and a plurality of memory control circuits for storing data as optical wave packets on corresponding ones of the plurality of storage elements. The control circuits include circuitry for converting an electrical signal into an optical wave packet and transmitting the wave packet on a corresponding one of the optical storage elements. Circuitry is also included for recirculating the wave packet on the selected optical storage element. Additionally, storage circuitry is included for detecting the wave packet on the optical storage element and recovering the electrical signal in response.

The principles of the present invention are further described in methods of storing data. According to one such method, a packet of photons is generated from an electrical signal and then transmitted on an electrical storage element having a predetermined delay between an input point of the packet and an output point of the packet. The packet is detected at the output point after the predetermined delay and the electrical signal is recovered.

The principles of the present invention allow for the construction of devices and systems which should be capable of meeting the high speed/high bit capacity data storage requirements expected for the next generations of information processing hardware. Moreover, in doing so, these principles do not require a light source of a specific frequency or that a specialized type of fiber optical filament be used, except to the extent that compatibility between the photon source, optical filament and detector must be maintained, as known in the art. Additionally, devices and systems embodying the inventive principles are essentially self-calibrating since speed can be varied as a function of the dimensions of the optical storage element. Also, devices embodying the invention have self-calibrating alignment. Advantageously, a substantial degree of freedom is allowed during the reduction of these principles to various applications.

BRIEF DESCRIPTION OF THE DRAWINGS

For a more complete understanding of the present invention, and the advantages thereof, reference is now made to the following descriptions taken in conjunction with the accompaning drawings, in which.

DESCRIPTION OF THE PREFERRED EMBODIMENTS

The principles of the present invention and their advantages are best understood by referring to the illustrated embodiment depicted in FIGS. 1–4 of the drawings, in which like numbers designate like parts.

Figure 1A:
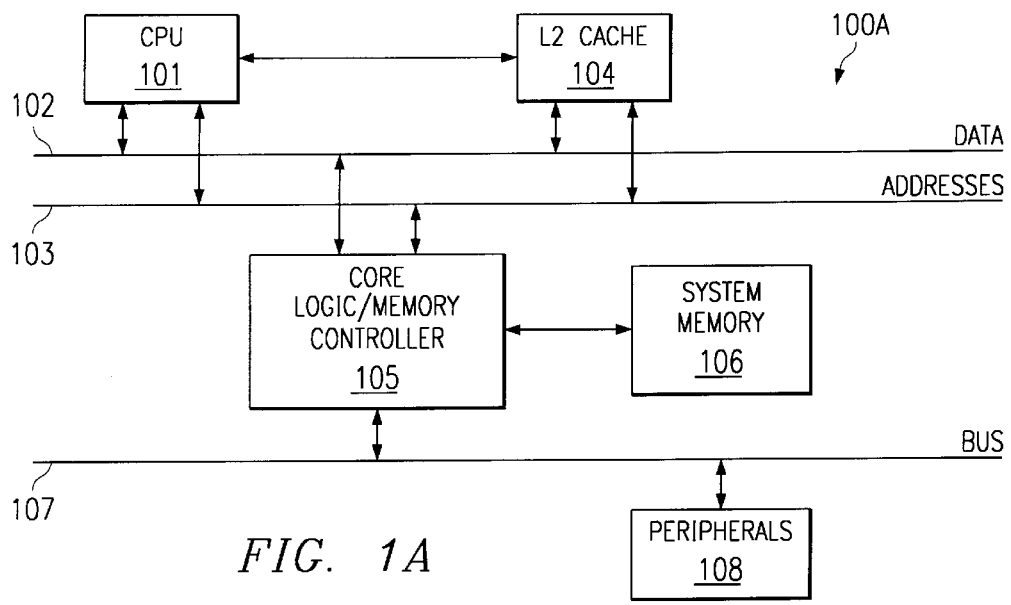
FIGS. 1A and 1B are block diagrams respectively depicting two basic system architectures typical of those found in personal computers.
Figure 1B:
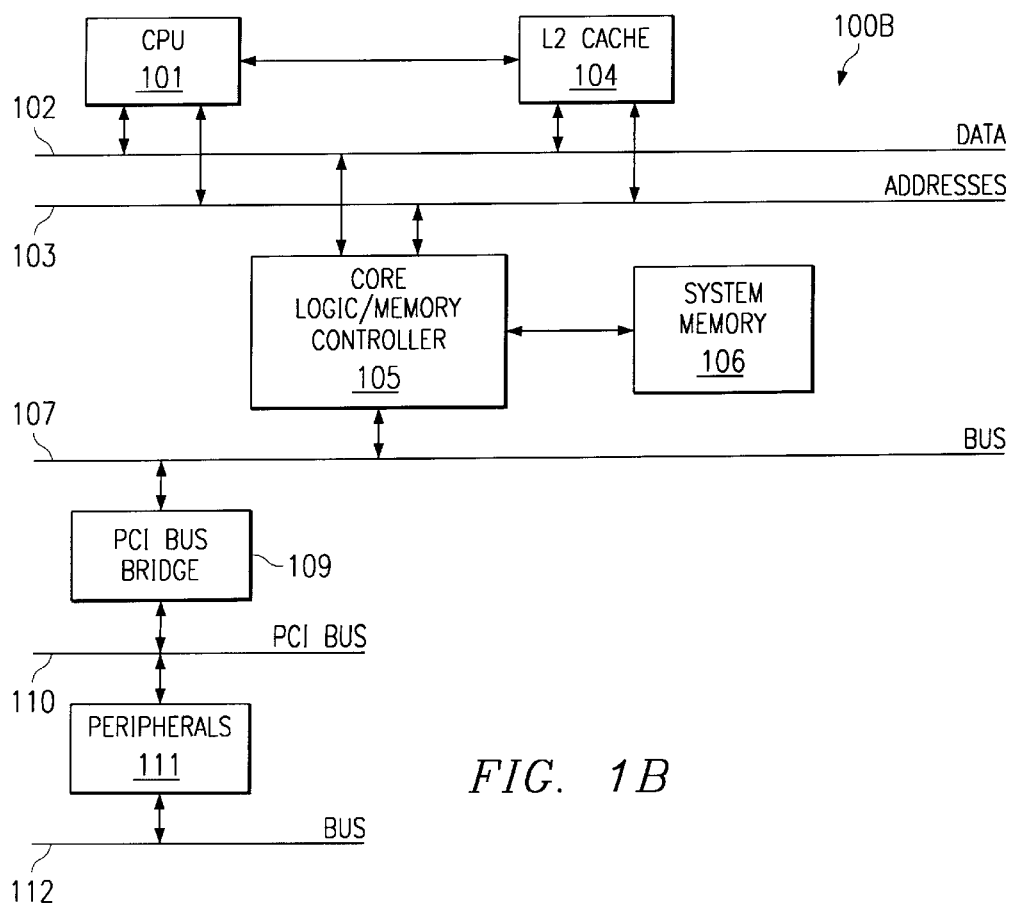

FIGS. 1A and 1B are block diagrams respectively depicting two basic system architectures 100A and 100B typical of those found in personal computers (PCs). While numerous variations on these basic architectures exist, FIGS. 1A and 1B are suitable for describing the basic structure and operation of most PCs. Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be an ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium™ class microprocessor, a reduced instruction set computer (RISC), such as an Apple PowerPC™ microprocessor, or a very long instruction word (VLIW) machine.

CPU 101 communicates with the remainder of system 100 via CPU local data and address buses 102 and 103, each of which may be for example a special bus, or a general bus, as known in the art.

Core logic/memory controller 105, under the direction of CPU 101, controls the exchange of data, addresses, control signals and instructions between CPU 101, system memory 106, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application are well known by those skilled in the art. The memory controller can be either a separate device or incorporated into the same chip set as the core logic. The memory controller is generally responsible for generating the memory clocks and control signals such as SCLK (System Clock) /RAS, /CAS, R/W and bank select, and monitors and controls cell refresh. The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache coherency, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 105 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 108/111 may include a display controller and associated frame buffer, floppy drive controller, disk driver controller, and/or modem, to name only a few options.

Figure 2:
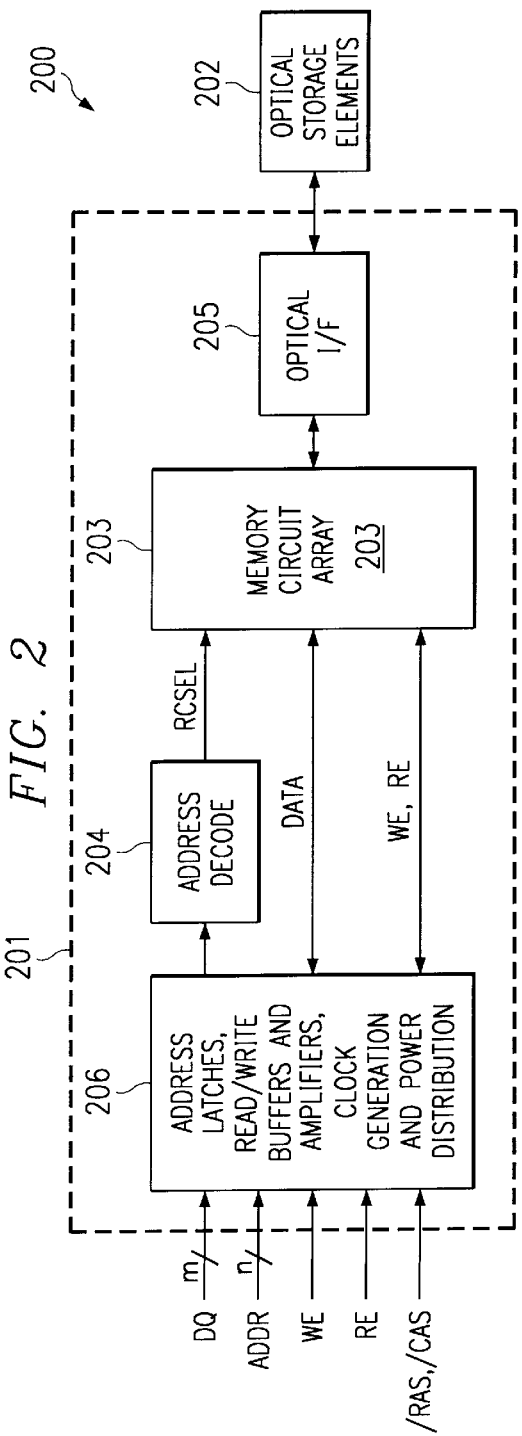
FIG. 2 is a high level functional block diagram of an optical memory embodying the teachings of the present invention.

FIG. 2 is a high level functional block diagram of an optical memory 200 embodying the teachings of the present invention. Memory 200 is suitable for such applications as system memory 106 in either of the exemplary processing environments shown in FIGS. 1A and 1B. Many other applications of memory 200 are possible.

Memory 200 includes an integrated circuit 201 and a set or array 202 of optical storage elements. An array of rows and columns of circuits 203, in conjunction with optical storage elements, provide a set of addressable optical storage cells 300 or 400 discussed below.

Generally, during an access, a circuit in the array at the intersection of a corresponding row and column is selected in response to received row and column address bits. An address decoder 204 decodes these address bits and generates internal row/column select signals RCSEL which activate the cell 300/400 being accessed. Data is exchanged between the selected circuit and a corresponding optical storage element 202 via an optical interface 205, which includes the transmitters and detectors described below.

Block 206 generally includes the input/output circuitry, including read and write buffers, address latches, power distribution circuitry and clock generation circuitry. Data is received through a m-bit wide DQ port from the core logic/memory controller and addresses through an n-bit wide address port ADDR. Write enable (WE) and read enable (RE) signals are received from the core logic/memory controller through corresponding pins.

The row and column address bits may be received simultaneously in non-multiplexed embodiments, or received word serial in multiplexed embodiments, similar to traditional DRAMs. In the multiplexed-address embodiments, row addresses are latched into address latches within block 206 through the multiplexed address lines on the falling edge of external /RAS while a column address is similarly latched through on the falling edge of external /CAS.

Figure 3:
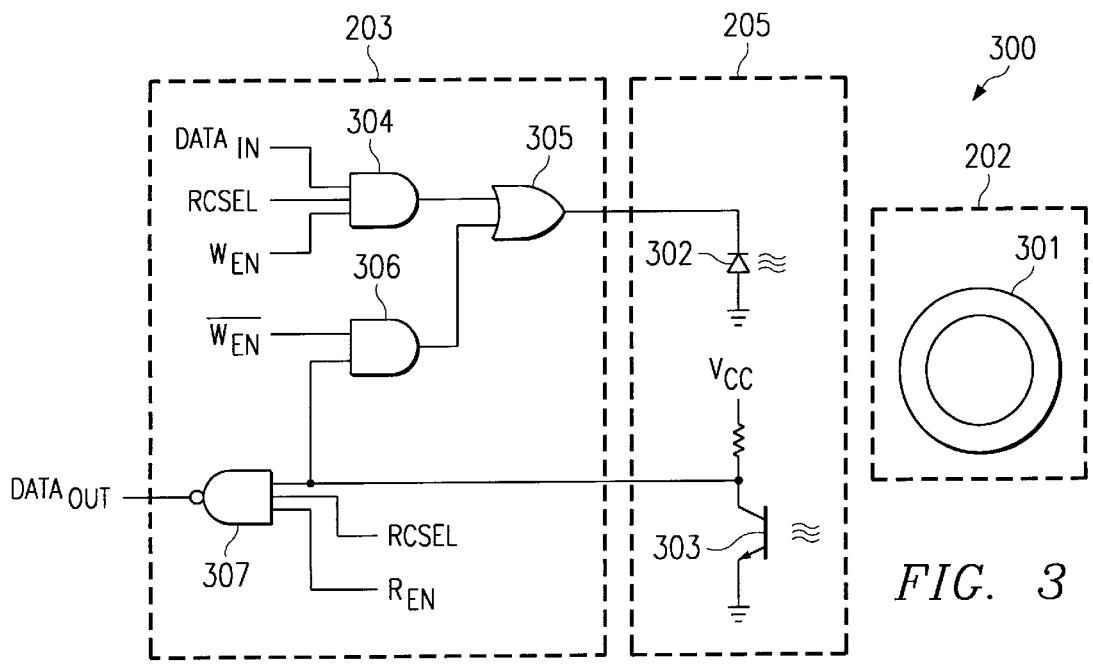
FIG. 3 is a electrical schematic diagram of an optical storage circuit suitable for storing information according to one embodiment of the principles of the present invention.

FIG. 3 is a electrical schematic diagram of an optical storage circuit 300 suitable for storing information according to one embodiment of the principles of the present invention. Generally, data are stored as a modulated stream of photons on a light transmitting optical storage element 301. Storage element 301 is preferably a filament of doped glass conventionally used in fiber-optic data transmission cables and similar applications. The filament may be formed as a closed loop and further may be coupled to a fiber-optic repeater for maintaining beam integrity. Additionally, signal dispersion compensation techniques known in the art, such as the use dispersion compensating optical fiber, may also be applied to further improve and maintain wave packet integrity. An open ended loop may also be used if the fiber is long enough to produce a delay approximating a desired storage time. Set 202 correspondingly is a bundle of similar fiber optic filaments.

In the illustrated embodiment, photons are transmitted across element 301 using a light emitting diode (LED) 302 and detected (received) using a phototransistor 303. Alternate transmission and/or detection circuits can also be used depending on the application. For example, the photon source could be a semiconductor laser. For storage of multiple bits of data in parallel, according to this embodiment, circuitry 300 is simply replicated as required to provide the desired number of parallel elements.

Figure 5:
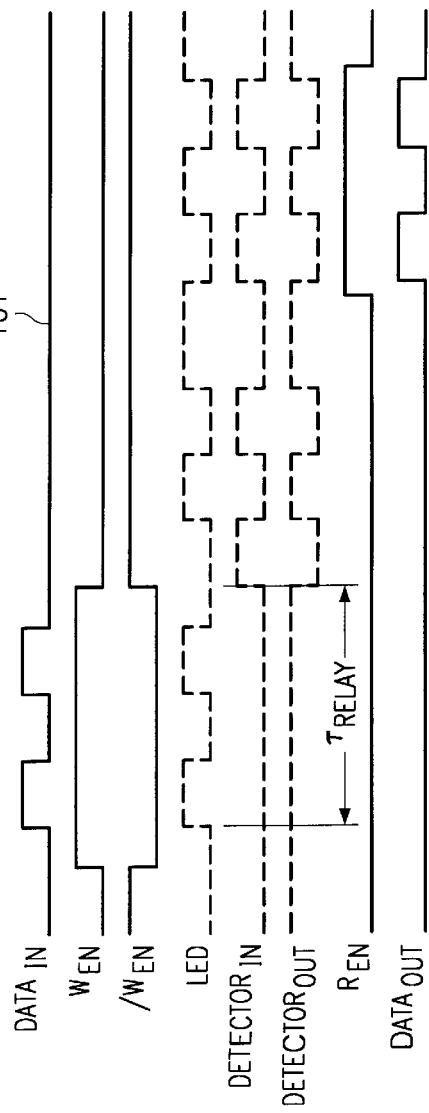
FIG. 5 is a timing diagram illustrating an exemplary data storage and retrieval operations according to the inventive principles.

The operation of optical storage circuit 300 can now be described with further reference to FIG. 5. Here, dashed lines represent the envelope of an optical wavepacket generated by LED 302.

During the write cycle, a data stream DATA$_{In}$, which could be either a digital or analog electrical signal, is presented at the first input to logic AND gate 304. In this case, the input signal is represented by a digital pulse train 101. At the same time, the write enable signal W$_{EN}$, presented to the second input of AND gate 304, is held in an active logic high state. The RCSEL also presented to AND gate 304 selects the optical circuit 300 being accessed. Consequently, the data stream is gated through AND gate 304 to the first input of logic OR gate 305, and subsequently passed on to LED 302. LED sinks the modulated current output from OR gate 305 and the resulting modulated photon stream is transmitted onto storage element 301 as an optical wave packet.

For a optical storage element comprised of a fiber-optic filament of approximately 15 cm in length, it takes approximately 0.5 nanoseconds for the photons transmitted from LED 302 to reach the input to detector 303 (i.e. $t_{DELAY}$=9.15 mS). Since data is being stored as a function of delay time, the length of storage element 301 will vary from embodiment to embodiment based on such factors as the length of the wavepackets being stored, the looseness of the medium, as well as desired storage time.

After traveling through optical storage element 301, the wavepacket turns on phototransistor 303 which in turn pulls down the first input to AND gate 306. Write enable signal W$_{EN}$ transitions low, as does the output of AND gate 304. The complement /W$_{EN}$ presented at the second input of AND gate 306 then transitions high to lock-in the data. The output of AND gate 306 consequently tracks the voltage appearing at the collector of phototransistor 303 which in turn is the inverse of the wavepacket traveling on the storage element. The loop formed by optical element 301, LED 302, phototransistor 303 and 305 recirculates the wavepacket in this fashion and the data is thereby stored in the time domain.

Reading data from optical storage circuitry 300 is effectuated through NAND gate 307 and the read enable signal R$_{EN}$. Specifically, when R$_{EN}$ transitions to a logic high state, the voltage at the collector of phototransistor 303 is gated to the data output DATA$_{OUT}$. The NAND gate serves to re-invert the data appearing at the phototransistor collector. In other words, the modulated photon stream on optical storage element 301 is sampled in electrical form at the collector of phototransistor 303 by selectively activating R$_{EN}$. During a read, W$_{EN}$ remains in an inactive logic low state.

Figure 4:
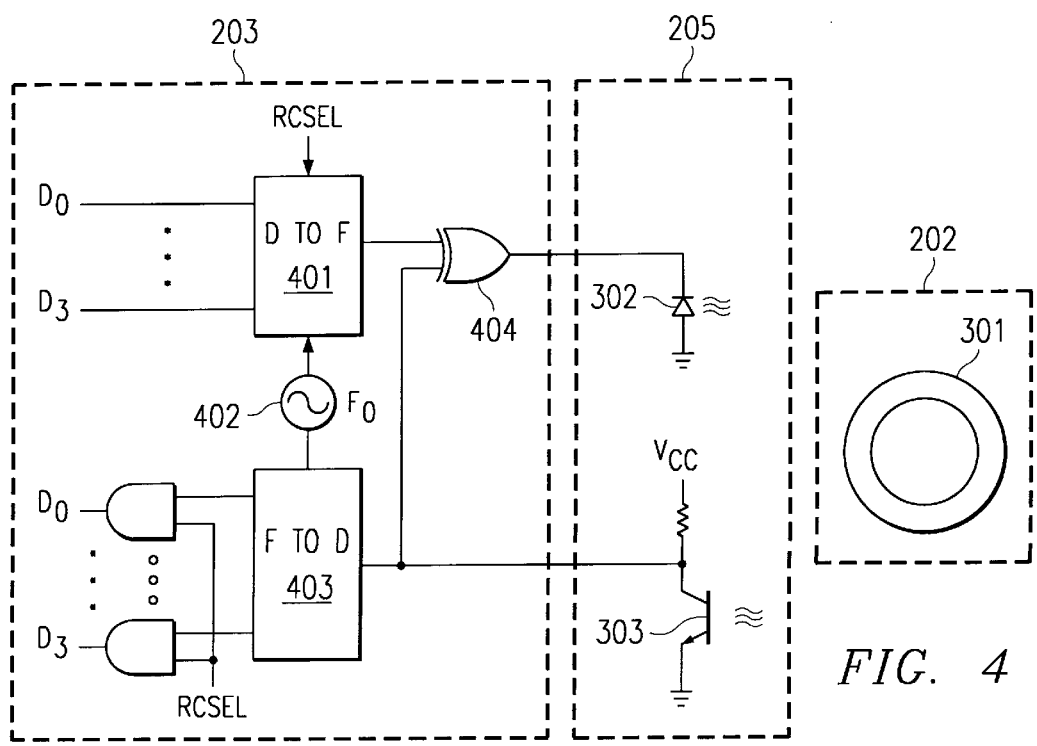
FIG. 4 is a schematic diagram of a second embodiment of the principles of the present invention.

FIG. 4 is a schematic diagram of a second embodiment of the principles of the present invention. As with the embodiment above, optical storage circuit 400 is a loop including and optical storage element 301, photon source 302 and photon detector 303. In this case however, multiple bits of input data are frequency encoded and then transmitted on element 301. This embodiment has the substantial advantage of providing for higher storage density (i.e. higher of number of bits stored per length of optical storage element 303).

In the illustrated embodiment, 4 bits of data (D$_0$–D$_3$) are being accessed, although circuit 400 can be extended to store bytes, words, double words, or data structures composed of a larger number of bits. The input bits are converted from digital form into an analog frequency using digital to frequency (D to f) converter 401 operating in response to a frequency source or oscillator 402. For discussion purposes, it will be assumed that oscillator generates a frequency of between 0 and 15 Hz. Each 1-bit incrementation of the 4-bit input data results in a 1 Hz incrementation in the output frequency of D to f converter 401. Frequency source 402 also drives a frequency to digital (f to D) converter 403 used to recover data.

In the illustrated embodiment, a plurality of circuits 400 each including a D to f converter 401, f to D converter 403, exclusive-OR(XOR) gate 404, are organized in array 203 and associated with a photon source 302 and photon detector 303. A corresponding optical storage element 301 is provided in set or bundle 202.

A write is initiated by activating the D to f converter 401 of the accessed location with the corresponding decoded address and presenting the data to be stored on lines D0–D3. The resulting frequency domain signal is optionally presented to the first input of XOR gate 404. The resulting frequency presented to LED 302 modulates the photon beam transmitted to storage element 301. The modulated beam (wave packet) is then stored on element 301. The loop composed of storage element 301, LED 302, phototransistor 303 and the second input to XOR gate 404 recirculates the data as described above for the first embodiment, and the data are consequently stored in the time domain. AND gate 405 gates the voltage at the collector of the photoelector with the write enable signal W$_{EN}$ to prevent a race condition.

To recover the data, the modulated signal at the collector of phototransistor 303 is returned to the digital domain by frequency-to-digital converter 403 and gated from the desired memory circuit 203 by generating the corresponding control signal RCSEL from the row and column addresses. The data are passed on as bits D0–D3 to the read buffers for transmission to the external circuit environment.

Advantageously, storage of data according to the principles of the present invention does not require a light source of a specific frequency or that a specialized type of fiber optical filament be used, except to the extent that the photon source, optical filament and detector compatibility must be maintained. Moreover, the systems described above are essentially self-calibrating since speed can be varied as a function of filament length. As a result, a substantial degree of freedom is allowed during the reduction of these principles in various applications.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. An optical memory comprising:
   an optical storage element for storing data as a packet of photons, said optical storage element delaying in time said packet of photons traveling through said storage element from a first point to a second point;
   a photon source for receiving an electrical signal representing said data and injecting said packet onto said optical storage element in response;
   a detector for selectively detecting said packet traveling on said optical storage element; and
   a feedback path coupling said photon source and said detector for recirculating said packet through said storage element.

2. The optical memory of claim 1 wherein said optical storage element comprises a fiber optic filament of a selected length.

3. The optical memory of claim 1 wherein said photon source comprises a light emitting diode.

4. The optical memory of claim 1 wherein said detector comprises a phototransistor.

5. The optical memory of claim 1 wherein said feedback path comprises a gate having a first input coupled to an output of said detector, an output coupled to said photon source, and a second input for receiving a control signal from selectively gating a signal output from said detector to said photon source.

6. The optical memory of claim 1 and further comprising a digital to frequency converter coupled to said photon source for receiving at least one bit of digital information and generating said electrical signal in response.

7. The optical memory of claim 1 and further comprising a frequency to digital converter coupled to said detector for converting an electrical signal output from said detector into at least one bit of digital information.

8. A data storage system comprising:
   a plurality of optical storage elements; and
   a plurality of memory control circuits for storing data as optical wave packets on corresponding ones of said plurality of storage elements comprising:
      circuitry for converting an electrical signal into a wave packet and transmitting said wave packet on a corresponding one of said optical storage elements;
      circuitry for recirculating said wave packet on said optical storage element; and
      circuitry for detecting said wave packet on said optical storage element and recovering said electrical signal in response.

9. The data storage system of claim 8 wherein said circuitry for converting comprises:
   a photon source; and
   logic for receiving data and selectively activating and deactivating said photon source in response.

10. The data storage system of claim 8 wherein said circuitry for recirculating comprises a feedback loop including a detector for detecting said wave packet transmitted on said storage element and generating a control signal in response and logic for selectively gating said control signal to said circuitry for converting.

11. The data storage system of claim 8 wherein said circuitry for detecting comprises a phototransistor.

12. The data storage system of claim 8 wherein said plurality of memory control circuits are fabricated on an integrated circuit chip.

13. The data storage system of claim 8 wherein said plurality of optical storage elements comprises a bundle of fiber optic filaments.

14. The data storage system of claim 8 wherein said photon source comprises a light emitting diode.

15. The data storage system of claim 8 wherein said photon source comprises a laser.

16. A method of storing data comprising the steps of:
   generating a packet of photons from an electrical signal;
   transmitting the packet of photons on an optical storage element having a predetermined delay between an input point of the packet and an output point of the packet; and
   detecting the packet at the output point after the predetermined delay and recovering the electrical signal.

17. The method of claim 16 and further comprising the steps of recirculating the packet comprising the steps of:
   detecting the packet at the output point;
   generating an electrical feedback signal from the detected packet; and
   generating a packet of photons from the feedback signal; and
   transmitting the packet on the optical storage element.

18. The method of claim 16 wherein said step of transmitting comprises the step of transmitting the packet on an optical fiber filament of a selected length.

19. The method of claim 18 wherein the filament forms a closed loop.

20. The method of claim 16 wherein said step of generating a packet comprises the step of modulating an output of a photon source with a digital signal.

* * * * *